US012782487B2

(12) United States Patent
Ramian

(10) Patent No.: US 12,782,487 B2
(45) Date of Patent: Nov. 3, 2026

(54) CALIBRATION METHOD AND CALIBRATION SYSTEM

(71) Applicant: Rohde & Schwarz GmbH & Co. KG, Munich (DE)

(72) Inventor: Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 146 days.

(21) Appl. No.: 18/962,439

(22) Filed: Nov. 27, 2024

(65) Prior Publication Data

US 2025/0244435 A1 Jul. 31, 2025

(30) Foreign Application Priority Data

Jan. 26, 2024 (EP) .................................... 24154150

(51) Int. Cl.
*G01R 35/00* (2006.01)

(52) U.S. Cl.
CPC .................................. *G01R 35/007* (2013.01)

(58) Field of Classification Search
None
See application file for complete search history.

(56) References Cited

U.S. PATENT DOCUMENTS 6,836,743 B1 12/2004 Blackham et al.
6,920,407 B2 * 7/2005 Adamian ............... G01R 27/28 324/638
8,508,241 B2 8/2013 Hauermann
10,191,092 B2 * 1/2019 Zietz .................. G01R 19/2509
10,514,436 B2 * 12/2019 Leibfritz .............. G01R 35/005
2008/0018342 A1 1/2008 Hiebel
2010/0204943 A1 8/2010 Hauermann
(Continued)

FOREIGN PATENT DOCUMENTS

CN 105044637 B * 6/2018
DE 102014200517 B4 * 5/2023 ........... G01R 35/005
(Continued)

OTHER PUBLICATIONS

Zimmerman, M. and I. Rolfes, "A Self-Calibration Technique for Microwave Multiport Measurements," Proceedings of the 47th European Microwave Conference; Oct. 10-12, 2014, Nuremberg, Germany; pp. 739-742.

*Primary Examiner* — Rodney E Fuller
(74) *Attorney, Agent, or Firm* — CHRISTENSEN O'CONNOR JOHNSON KINDNESS PLLC

(57) ABSTRACT

A calibration method of calibrating a test instrument includes the following: consecutively connecting a set of calibration standards to at least one port and performing a calibration measurement for each calibration standard connected, thereby obtaining a first set of measurement data; determining, based on a multi-port error model and the first set of measurement data, a plurality of error terms of the multi-port error model, wherein at least one of the error terms includes a product of two error parameters; connecting an additional calibration standard to the at least one port; performing a calibration measurement with the additional calibration standard connected, thereby obtaining a second set of measurement data; and determining the two error parameters based on the second set of measurement data. Further, a calibration system is described.

17 Claims, 4 Drawing Sheets

(56) References Cited

U.S. PATENT DOCUMENTS

| | | | | |
|---|---|---|---|---|
| 2017/0160369 | A1 | 6/2017 | Leibfritz | |
| 2025/0271492 | A1 * | 8/2025 | Ramian | G01R 27/28 |
| 2025/0306155 | A1 * | 10/2025 | Mueller-Remer | G01R 31/2834 |

FOREIGN PATENT DOCUMENTS

| | | | | |
|---|---|---|---|---|
| EP | 0430475 | A2 * | 6/1991 | G01R 35/005 |
| EP | 2156202 | B1 | 4/2008 | |

* cited by examiner

CALIBRATION METHOD AND CALIBRATION SYSTEM

FIELD OF THE DISCLOSURE

Embodiments of the present disclosure generally relate to a calibration method of calibrating a test instrument. Embodiments of the present disclosure further relate to a calibration system.

BACKGROUND

In order to perform accurate measurements on a device under test, the test setup comprising a test instrument has to be calibrated, thereby ensuring a maximum accuracy of the measurements conducted.

For example, one calibration technique known in the state of the art is a so-called OSM-calibration, wherein three different calibration standards ("open", "short", and "matched") are consecutively connected to the test instrument and corresponding reflection measurements are performed, respectively. The OSM-calibration is also known as SOL-calibration ("short", "open", "load").

If the test instrument comprises more than one port that is to be connected to the device under test, additional relative measurements between the ports have to be performed, for example by adding a "through" calibration measurement (TOSM-method) or an "unknown" calibration measurement (UOSM-method). The TOSM-method is also known as SOLT-method ("short", "open", "load", "through").

To fully characterize a test instrument, the relative measurements have to be performed for each pair of ports. Thus, the number of measurements necessary grows rapidly with the number of ports.

Thus, there is a need for a calibration method and system that allow for a full characterization of each port with a reduced number of measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a calibration method of calibrating a test instrument. The test instrument comprises, for example, at least one port, at least one signal analysis circuit, and at least one signal generator circuit. The at least one signal analysis circuit and the at least one signal generator circuit are each connected to the at least one port. In an embodiment, the calibration method comprises:

consecutively connecting a set of calibration standards to the at least one port and performing a calibration measurement for each calibration standard connected, thereby obtaining a first set of measurement data;

determining, based on a multi-port error model and the first set of measurement data, a plurality of error terms of the multi-port error model, wherein the error terms describe transmissivity and reflectivity properties of at least the at least one port, and wherein at least one of the error terms comprises a product of two error parameters;

connecting an additional calibration standard to the at least one port, wherein the additional calibration standard is a signal source with known properties or a signal sink with known properties;

performing a calibration measurement with the additional calibration standard connected, thereby obtaining a second set of measurement data; and determining the two error parameters based on the second set of measurement data.

As use herein, the terms "error term" and "error parameter" are understood to denote parameters of the multi-port error model describing transmissivity and reflectivity properties of a portion of the measurement setup including the port.

Based on the determined error terms and error parameters, operational parameters of the test instrument can be adjusted, i.e. the test instrument can be calibrated with respect to the at least one port. For example, the operational parameters may be corrected in time domain or in frequency domain.

With previously known calibration methods, the at least one error term comprising the product of the two error parameters can only be determined as a whole, while the individual error parameters cannot be determined based on measurements on the at least one port alone.

The calibration method according to aspects of the present disclosure is based on the idea to provide an additional calibration standard with known properties. Performing the additional calibration measurement on the additional calibration standard allows to disentangle the product of the two error parameters, such that the individual error parameters can be determined. This allows the determination of all necessary parameters of the multi-port error model based on measurements conducted on the at least one port alone. In other words, the at least one port of the test instrument can be fully characterized based on measurements conducted on the at least one port alone, i.e. independent of other ports of the test instrument. As a result, the necessary number of measurements is reduced if the test instrument comprises a plurality of ports.

It is to be understood that the calibration method according to aspects of the present disclosure can likewise be applied to test instruments with only one port. In this case, the calibration method allows for a full characterization of the single port.

The inventors of the present disclosure have also realized that the calibration method disclosed herein is also suitable for calibrating vector network analyzers, for example modulated vector network analyzers.

In an embodiment, the calibration method may comprise the action or step of providing the test instrument comprising the at least one port, the at least one signal analysis circuit, and the at least one signal generator circuit, wherein the at least one signal analysis circuit and the at least one signal generator circuit are each connected to the at least one port.

Optionally, the calibration method may comprise the step of connecting the at least one signal analysis circuit and/or the at least one signal generator circuit to the at least one port, for example if the at least one signal analysis circuit and/or the at least one signal generator circuit are/is not connected to the at least one port in an initial state of the test instrument.

According to an aspect of the present disclosure, the calibration standards, for example, are connected to the at least one port at a reference plane. Accordingly, the first set of measurement data and the second set of measurement data are obtained with respect to the reference plane, which may include a connection between the at least one port and reference plane, such as a cable. Thus, the multi-port error model describes transmissivity and reflectivity properties of a portion of the measurement setup including the port and the reference plane, for example including a cable connecting the at least one port to the reference plane.

In an embodiment, the reference plane may correspond to the plane at which a device under test is to be connected to the at least one port.

In an embodiment, a cable is connected to the at least one port, wherein the reference plane is located at an end of the cable facing away from the at least one port. Thus, the multi-port error model describes transmissivity and reflectivity properties of a portion of the measurement setup including the port, the cable, and the reference plane. This way, the accuracy of the calibration or of subsequent measurements on a device under test can be enhanced, as connections between the test instrument and the device under test, namely the cable, are incorporated into the calibration.

According to another aspect of the present disclosure, the product of two error parameters, for example, comprises a first error parameter and a second error parameter, wherein the first error parameter is determined directly based on the second set of measurement data, and wherein the second error parameter is calculated based on the determined product of the two error parameters and based on the first error parameter. In other words, one of the two error parameters can be measured directly, while the other one of the two error parameters can be then determined or calculated, as the product of the two error parameters has already been determined based on the first set of measurement data.

It is noted that it is in principle also possible to conduct another measurement with another known calibration standard, such that both error parameters can be measured directly. However, this requires an additional measurement step.

A further aspect of the present disclosure provides, for example, that a mismatch of the additional calibration standard is corrected based on the first set of measurement data. In an embodiment, an impedance mismatch between the additional calibration standard and the reference plane may be corrected based on the first set of measurement data. Thus, the second set of measurement data can be determined with enhanced accuracy, as the mismatch is corrected based on the first set of measurement data.

In another embodiment, the test instrument comprises at least one directional coupler. The at least one signal analysis circuit and the at least one signal generator circuit are connected to the at least one port by the at least one directional coupler. For example, each port is connected to at least one signal generator circuit and to at least one signal analysis circuit via the at least one directional coupler. This way, all necessary calibration measurements can be performed on the at least one port independent of other ports in a particularly efficient way.

In an embodiment, the multi-port error model may be an n-term error model, for example a four-term error model. Accordingly, the multi-port error model comprises n error parameters that need to be determined in order to calibrate the test instrument, i.e. the error terms comprise a total of n error parameters.

In a certain embodiment, n is an integer greater than 1, for example equal to or greater than 4. However, it is to be understood that any other suitable error model may be used, for example a 12-term error model.

In an embodiment, the multi-port error model is a two-port error model. Therein, one port of the error model may be associated with the signal generator circuit or the signal analysis circuit, while the other port of the error model may be associated with the reference plane. The error model describes transmissivity and reflectivity properties within a portion of the test system modeled by the error model, namely a portion of the test system between the signal generator circuit or the signal analysis circuit and the reference plane.

According to an aspect of the present disclosure, exactly one port of the test instrument is calibrated at a time. As already explained above, the calibration method allows for calibration of each port independent of other ports. Thus, different ports of the test instrument can be calibrated consecutively.

In an embodiment, the additional calibration standard is established as a signal generator, a comb generator, an oscilloscope, or an analog-to-digital converter. For example, the additional calibration standard may be established as a signal generator with known properties, a comb generator with known properties, an oscilloscope with known properties, or an analog-to-digital converter with known properties. However, it is to be understood that any other suitable type of additional calibration standard may be used.

According to another aspect of the present disclosure, the individual calibration standards of the set of calibration standards are provided, for example, in a calibration device having a housing. The calibration device further comprises a switching circuit and a connecting port. The switching circuit is configured to selectively connect one of the calibration standards to the connecting port. Thus, a particularly convenient way of obtaining the first set of measurement data is provided, as the calibration standards can simply be connected to the at least one port of the test instrument by connecting the calibration standards to the connecting port consecutively via the switching circuit. Thus, it is not necessary to change the measurement setup for performing the calibration measurements on the different calibration standards.

In example embodiments, the connecting port may be connected to the at least one port of the test instrument, for example by a cable.

For example, the set of calibration standards may comprise three different calibration standards. The three different calibration standards may be provided in the housing of the calibration device. For example, the three different calibration standards may be "open", "short", and "matched". However, any other suitable set of calibration standards may be used.

In an embodiment, the additional calibration standard may be provided in the housing. The switching circuit may be configured to selectively connect one of the calibration standards or the additional calibration standard to the connecting port. Thus, a particularly convenient way of obtaining the first set of measurement data and the second set of measurement data is provided, as the calibration standards and the additional calibration standard can simply be connected to the at least one port of the test instrument by connecting the calibration standards to the connecting port consecutively via the switching circuit. Thus, it is not necessary to change the measurement setup for performing the calibration measurements on the different calibration standards and on the additional calibration standard.

Alternatively, the additional calibration standard may be provided separately from the calibration device, wherein the calibration device comprises a further connecting port, and wherein the switching circuit is configured to selectively connect one of the calibration standards or the further connecting port to the connecting port. Thus, the additional calibration standard being provided separately from the calibration device may be connected to the further connecting port, for example by a cable, such that the switching circuit can selectively connect one of the calibration standards or the additional calibration standard to the connecting port and thus to the test instrument. Providing the additional calibration standard outside of the housing of the calibration device is particularly advantageous if the additional calibration standard generates a significant amount of heat.

In an embodiment, the test instrument is a vector network analyzer, a signal generator, for example a vector signal generator, or a signal analyzer, for example a vector signal analyzer. In an embodiment, the test instrument may be a modulated vector network analyzer.

If the test instrument is a signal analyzer, for example a vector signal analyzer, the test instrument may still comprise the signal generator circuit. The signal generator circuit may serve as a "helper" circuit for performing the calibration method described above.

If the test instrument is a signal generator, for example a vector signal generator, the test instrument may still comprise the signal analysis circuit. The signal analysis circuit may serve as a "helper" circuit for performing the calibration method described above.

However, it is to be understood that any of (e.g., all of) the calibration methods described above can be applied to any other test instrument having at least one port, for example to oscilloscopes, spectrum analyzers, etc.

Embodiments of the present disclosure further provide a calibration system. In an embodiment, the calibration system comprises a test instrument, a set of calibration standards, and an additional calibration standard. The calibration system is configured to perform any of (e.g., all of) the calibration methods described above.

Regarding the advantages and further properties of the calibration system, reference is made to the explanations given above with respect to the calibration method, which also hold for the calibration system and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
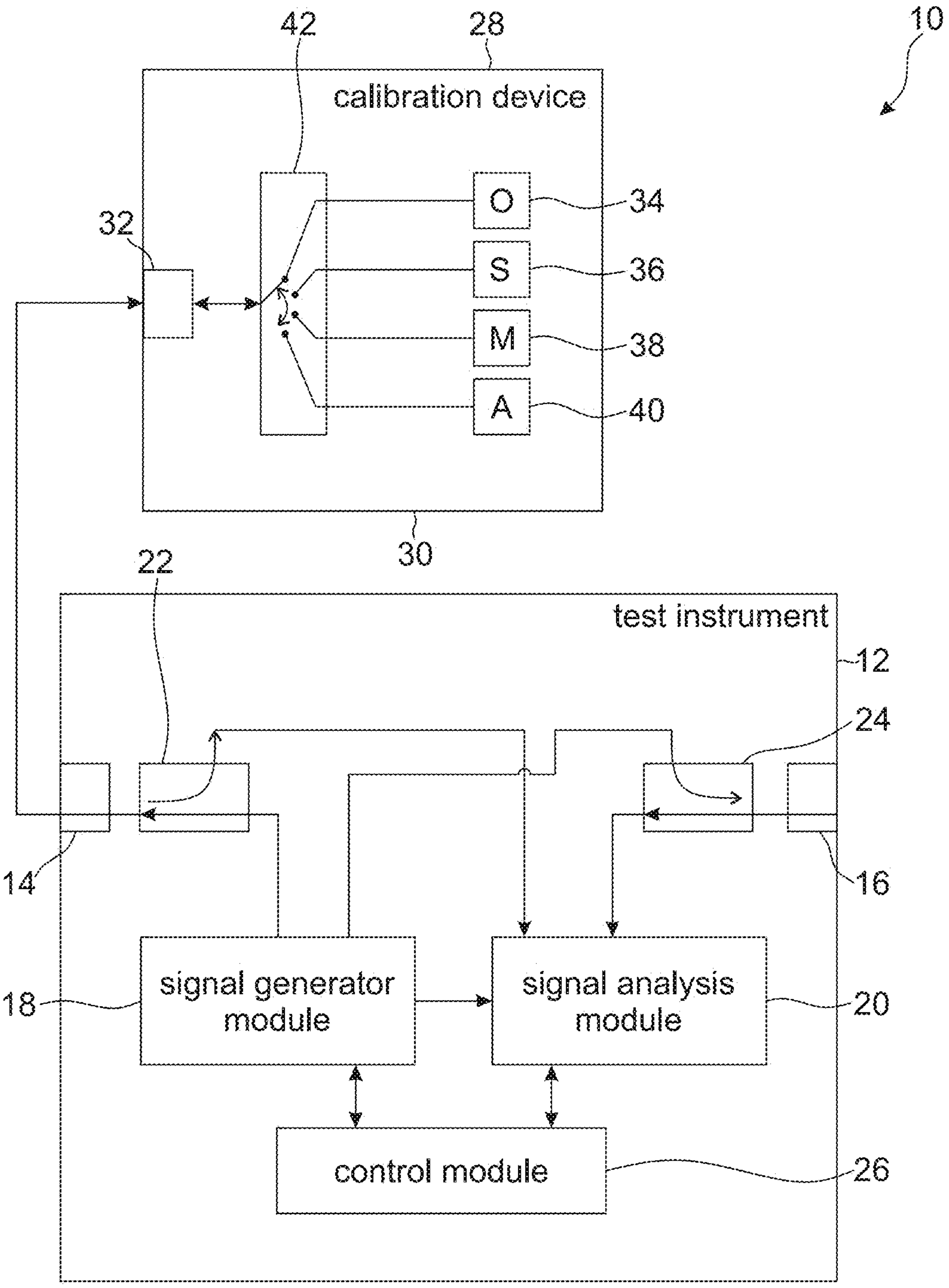
FIG. 1 schematically shows a calibration system according to an embodiment of the present disclosure.

FIG. 1 schematically shows an example embodiment of calibration system 10 for calibrating a test instrument 12. In the example embodiment shown in FIG. 1, the test instrument 12 may be established as a vector network analyzer comprising a first port 14 and a second port 16.

For example, the test instrument 12 may be a modulated vector network analyzer. However, it is to be understood that the explanations given hereinafter likewise apply to other types of test instruments that may have the same or a different number of ports. For example, the test instrument 12 may be a signal analyzer, a vector signal analyzer, a signal generator, a vector signal generator, a spectrum analyzer, or an oscilloscope.

Without restriction of generality, the example embodiment of the test instrument 12 shown in FIG. 1 is described hereinafter. The test instrument 12 comprises a signal generator circuit 18 and a signal analysis circuit 20. The signal generator circuit 18 is configured to generate a test signal that can be applied to a device under test via the first port 14. In an embodiment, the signal generator circuit 18 may be or comprise a vector signal generator.

In an embodiment, the signal analysis circuit 20 is configured to receive a corresponding processed signal from the device under test via the second port 16, and to analyze the processed signal in order to assess a performance of the device under test. In an embodiment, the signal analysis circuit 20 may be or comprise a vector signal analyzer.

In the example embodiment shown in FIG. 1, the signal generator circuit 18 and the signal analysis circuit 20 are each connected to the first port 14 via a first directional coupler 22. The first directional coupler 22 is configured to transmit a forward-travelling signal from the signal generator circuit 18 to the first port 14. The first directional coupler 22 is further configured to transmit a backward-travelling signal from the first port 14 to the signal analysis circuit 20.

In the example embodiment shown in FIG. 1, the signal generator circuit 18 and the signal analysis circuit 20 are also each connected to the second port 16 via a second directional coupler 24. The second directional coupler 24 is configured to transmit a forward-travelling signal from the second port 16 to the signal analysis circuit 20. The second directional coupler 24 is further configured to transmit a backward-travelling signal from the signal generator circuit 18 to the second port 16.

In the example embodiment shown in FIG. 1, the test instrument 12 further comprises a control circuit 26 that is configured to control the signal generator circuit 18 and/or the signal analysis circuit 20. For example, the control circuit 26 may be configured to set operational parameters of the signal generator circuit 18 and/or of the signal analysis circuit 20, for example frequency ranges, a bandwidth, a sampling rate, filter coefficients, etc.

As shown in FIG. 1, the calibration system 10 further comprises a calibration device 28 that is provided separately from the test instrument 12. In an embodiment, the calibration device 28 comprises a housing 30 that is established separately from the test instrument 12, wherein the components described hereinafter are provided in the housing 30.

In an embodiment, the calibration device 28 comprises a connecting port 32 that is connectable to the first port 14 and/or to the second port 16 of the test instrument 12. The calibration device 28 further comprises a set of calibration standards, wherein the set of calibration standards comprises a first calibration standard 34, a second calibration standard 36, and a third calibration standard 38.

For example, the first calibration standard 34, the second calibration standard 36, and the third calibration standard 38 may correspond to "open" ("O"), "short" ("S"), and "matched" ("M") calibration standards, respectively. However, it is to be understood that the set of calibration standards may comprise other suitable types of calibration standards.

Moreover, an additional calibration standard 40 ("A") is provided within the housing 30 in the example embodiment shown in FIG. 1. In general, the additional calibration standard 40 is a signal source with known properties or a signal sink with known properties. For example, the additional calibration standard 40 may be established as a signal generator, a comb generator, or an analog-to-digital converter.

In the example embodiment shown in FIG. 1, the calibration device 28 further comprises a switching circuit 42 that is connected to the connecting port 32 as well as to the calibration standards 34, 36, 38, 40. The switching circuit 42 is configured to selectively connect one of the calibration standards 34, 36, 38 or the additional calibration standard 40 to the connecting port 32.

Figure 2:
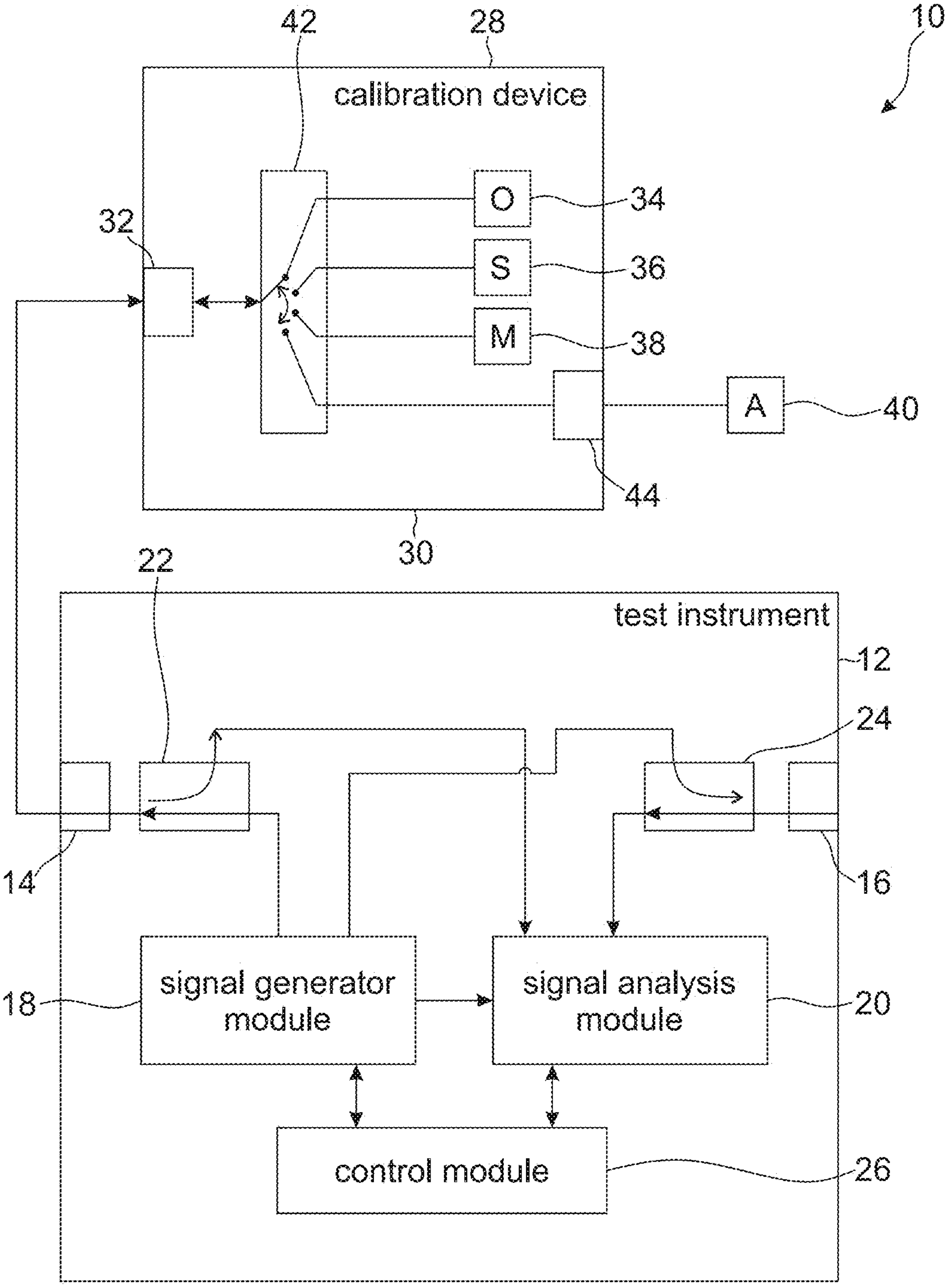
FIG. 2 schematically shows a calibration system according to another embodiment of the present disclosure.

FIG. 2 shows another embodiment of the calibration system 10, wherein only the differences to the system of FIG. 1 described above are explained hereinafter.

As shown in FIG. 2, the additional calibration standard 40 is provided separately from the calibration device 28. For example, the additional calibration standard 40 may be established as a signal generator, a comb generator, an oscilloscope, or an analog-to-digital converter.

In this embodiment, the calibration device 28 comprises another connecting port 44 that is connected to the switching circuit 42. The connecting port 44 is connectable to the additional calibration standard 40, such that the additional calibration standard can be connected to the connecting port 32 via the switching circuit 42 and the further connecting port 44. The switching circuit 42 is configured to selectively connect one of the calibration standards 34, 36, 38 or the further connecting port 44 to the connecting port 32.

It is noted that the calibration device 28 according to any of the embodiments described above is optional. It is also possible to connect the individual calibration standards 34, 36, 38 and/or the additional calibration standard 40 to the test instrument 12 directly, i.e. directly via a cable.

In an embodiment, the test instrument 12 may comprise more than one signal generator circuit, and/or more than one signal analysis circuit, and/or another number of ports.

In any case, each port is connected to at least one signal generator circuit, for example to exactly one signal generator circuit, and to at least one signal analysis circuit, for example to exactly one signal analysis circuit.

Figure 3:
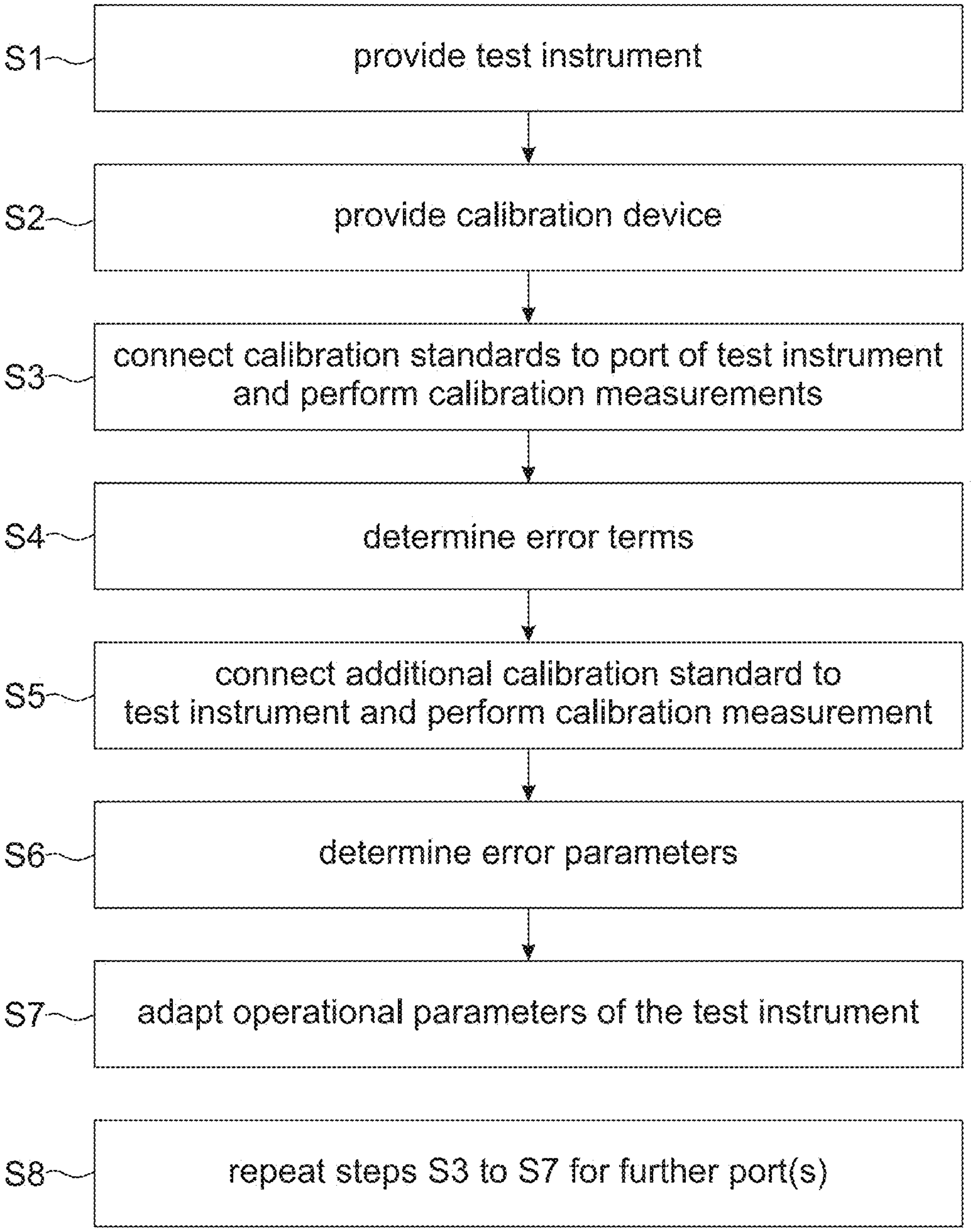
FIG. 3 shows a representative flow chart of a calibration method according to an embodiment of the present disclosure.

Hereinafter, a calibration method of calibrating the test instrument 12 is described with reference to FIG. 3.

The test instrument 12 described above is provided (step S1). Optionally, the calibration device 28 described above is provided (step S2). Hereinafter, it is assumed without restriction of generality that the calibration device 28 is provided. However, it is to be understood that the steps described hereinafter can also be performed without the calibration device 28 with appropriate adjustments.

The calibration standards 34, 36, 38 of the set of calibration standards are consecutively connected to the first port 14 of the test instrument, and a respective calibration measurement is performed by the signal generator circuit 18 and the signal analysis circuit 20 for each of the calibration standards 34, 36, 38 (step S3).

In an embodiment, a first calibration measurement is conducted with the first calibration standard 34 being connected to the first port 14. Afterwards, a second calibration measurement is conducted with the second calibration standard 36 being connected to the first port 14. Finally, a third calibration measurement is conducted with the third calibration standard 38 being connected to the first port 14.

In an embodiment, the calibration measurements conducted may be reflection measurements, i.e. a test signal is generated by the signal generator circuit 18 and forwarded to the respective calibration standard 34, 36, 38 via the first port 14, the connecting port 32, and the switching circuit 42. A signal reflected by the respective calibration standard 34, 36, 38 is forwarded to the signal analysis circuit 20 via the switching circuit 42, the connecting port 32, the first port 14, and the first directional coupler 22.

The signal analysis circuit 20 analyzes the respective reflected signals, thereby obtaining a first set of measurement data. In an embodiment, the first set of measurement data comprises measurement data on each of the calibration standards 34, 36, 38.

It is noted that starting the calibration of the test instrument 12 with the first port 14 is not necessary. Likewise, the calibration could first be performed on the second port 16 or on other ports of the test instrument 12.

A plurality of error terms of a multi-port error model are determined based on the multi-port error model and based on the first set of measurement data by the signal analysis circuit 20 (step S4).

In general, the error terms of the multi-port error model describe transmissivity and reflectivity properties of at least the respective port, i.e. of the first port 14 in the case described above. For example, the multi-port error model comprises error terms describing the transmissivity and reflectivity properties, wherein the error terms comprise one or more error parameters each.

Figure 4:
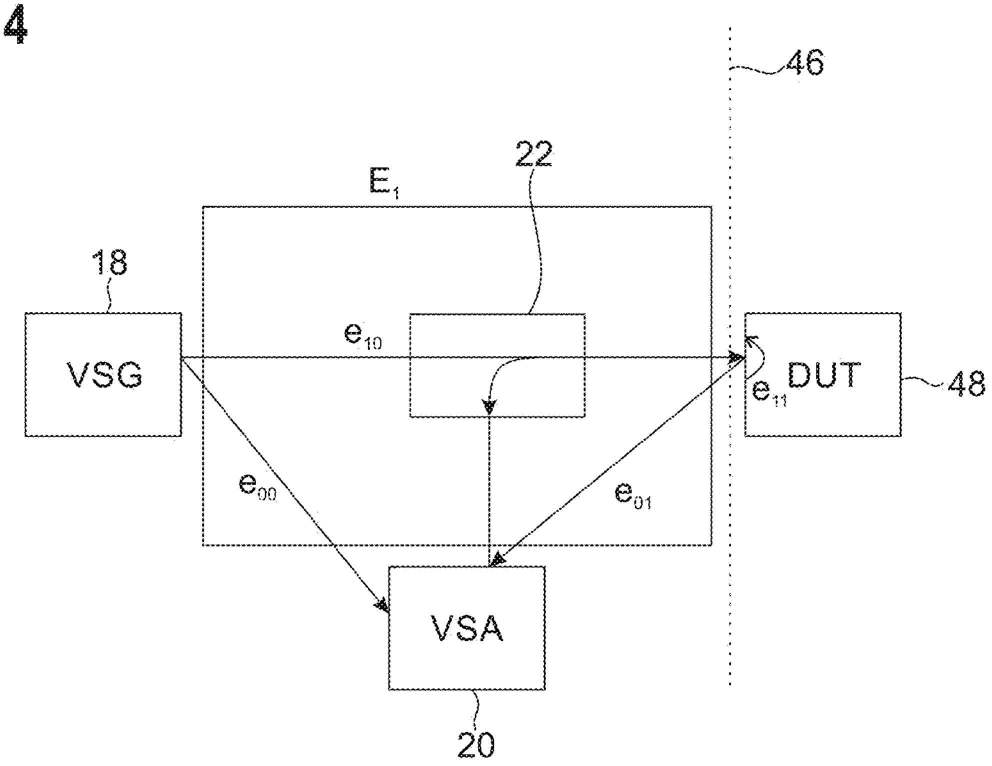
FIG. 4 shows a multi-port error model according to an embodiment.

FIG. 4 shows an example embodiment of a multi-port error model. In the embodiment of FIG. 4, the multi-port error model is a 2-port error model with four error parameters $e_{00}$, $e_{10}$, $e_{01}$, and $e_{11}$. However, it is to be understood that any other suitable multi-port error model may be used. In an embodiment, the multi-port error model may be any suitable n-term error model comprising n error parameters.

The error model of FIG. 4 describes a portion of the calibration system 10 between the signal generator circuit 18 and a reference plane 46. As is illustrated in FIG. 4, the reference plane 46 is located at the point where a device under test (DUT) 48 is to be connected to the first port 14.

During the calibration, the calibration device 28 is connected to the first port 14 at the reference plane 46. Thus, the reference plane 46 may be at an end of a cable connecting the first port 14 and the calibration device 28, namely at the end of the cable facing away from the first port 14.

The four error parameters $e_{00}$, $e_{10}$, $e_{01}$, and $e_{11}$ describe a transmission between the signal generator circuit 18 and the signal analysis circuit 20, a transmission between the signal generator circuit 18 and the reference plane 46, a transmission between the reference plane 46 and the signal analysis circuit 20, and a reflection at the reference plane 46, respectively.

The multi-port error model can be expressed as a matrix $$E_1 = \begin{pmatrix} e_{00} & e_{01} \\ e_{10} & e_{11} \end{pmatrix}.$$

In this example, the error terms $e_{00}$, $e_{11}$, and $e_{01}\cdot e_{10}$ can be determined based on the first set of measurement data, i.e. one of the determined error terms comprises a product of two error parameters that cannot be determined individually based on the first set of measurement data.

In an embodiment, the additional calibration standard 40 is connected to the first port 14, and an additional calibration measurement is performed with the additional calibration standard 40 connected to the first port 14 by the signal generator circuit 18 and the signal analysis circuit 20, thereby obtaining a second set of measurement data (step S5).

In an embodiment, a mismatch of the additional calibration standard 40 may be corrected based on the first set of measurement data for determining the second set of measurement data. For example, an impedance mismatch between the additional calibration standard 40 and the reference plane 46 may be corrected based on the first set of measurement data for determining the second set of measurement data.

The error parameters comprised in the product of error parameters are determined based on the second set of measurement data by the signal analysis circuit 20 (step S6). For example, one of the two error parameters comprised in the product of error parameters is determined directly based on the second set of measurement data, i.e. one of the two error parameters is measured directly.

The other one of the two error parameters can then be calculated based on the determined product and based on the measured error parameter of the product.

In the example multi-port error model described above, if the additional calibration standard is a signal source, the error parameter $e_{01}$ can be measured directly, and the error parameter $e_{10}$ can then be calculated.

If the additional calibration standard is a signal sink, the error parameter $e_{10}$ can be measured directly, and the error parameter $e_{01}$ can then be calculated.

Thus, all error parameters of the multi-port error model are determined based on measurements performed with respect to the first port 14 only.

Operational parameters of the test instrument 12, for example of the signal generator circuit 18 and/or of the signal analysis circuit 20, are adapted based on the determined error parameters by the control circuit 26 (step S7).

Accordingly, the test instrument 12 is calibrated with respect to the first port 14 based on the determined error parameters.

In an embodiment, the calibration may be performed in time domain or in frequency domain.

Steps S3 to S7 described above are then repeated for the second port 16 (step S8).

Figure 5:
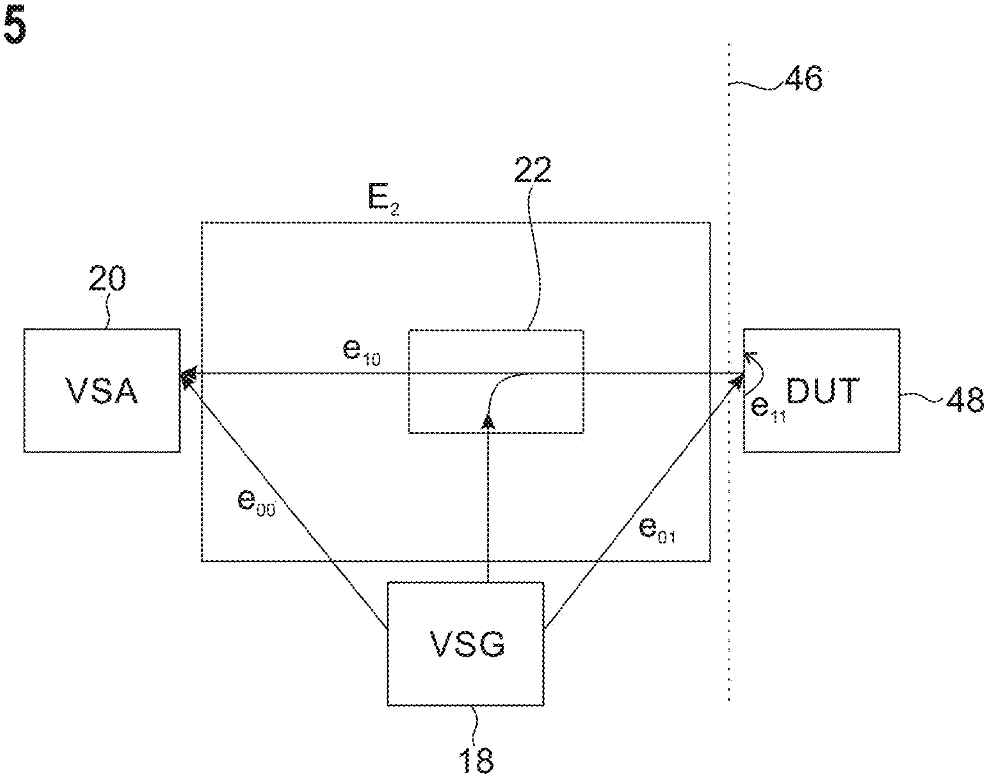
FIG. 5 shows a multi-port error model according to another embodiment.

The multi-port error model for calibrating the second port 16 is shown in FIG. 5, and is established similarly to the multi-port error model for calibrating the first port 14 described above.

The four error parameters $e_{00}$, $e_{10}$, $e_{01}$, and $e_{11}$ describe a transmission between the signal generator circuit 18 and the signal analysis circuit 20, a transmission between the reference plane 46 and the signal analysis circuit 20, a transmission between the signal generator circuit 18 and the reference plane 46, and a reflection at the reference plane 46, respectively.

The multi-port error model can be expressed as a matrix $$E_2 = \begin{pmatrix} e_{00} & e_{01} \\ e_{10} & e_{11} \end{pmatrix}.$$

If the test instrument 12 comprises further ports, the further ports can be calibrated consecutively, i.e. one port may be fully calibrated at a time.

Thus, the calibration method described above enables a full calibration of all ports of the test instrument 12, wherein each port can be calibrated independent of any other ports.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a graphics processing unit (GPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiment, these components, or parts thereof, may be grouped in a single location or distributed over a wide area. In circumstances where the components are distributed, the components are accessible to each other via communication links.

In some embodiments, one or more of the components of the test instrument 12, the calibration device 28, the addition calibration standard 40 of FIG. 2, etc., referenced above include circuitry programmed to carry out one or more steps of any of the methods disclosed herein. In an embodiment, one or more computer-readable media associated with or accessible by such circuitry contains computer readable instructions embodied thereon that, when executed by such circuitry, cause the component or circuity to perform one or more steps of any of the methods disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible by a computing device, such as processor circuitry, etc., or other circuity disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

It will be appreciated that in one or more embodiments, the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), a graphics processing unit (GPU) or the like, or any combinations thereof.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

In the detailed description herein, references to "one embodiment", "an embodiment", "an example embodiment", "one or more embodiments", "some embodiments", etc., indicate that the embodiment or embodiments described may include a particular feature, structure, or characteristic, but every embodiment may not necessarily include the particular feature, structure, or characteristic. Moreover, such phrases are not necessarily referring to the same embodiment or embodiments. In addition, when a particular feature, structure, or characteristic is described in connection with an embodiment or embodiments, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. While the stated range includes one or both of the limits, ranges excluding either or both of those included limits are also included in the disclosure.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A calibration method of calibrating a test instrument, the test instrument having at least one port, at least one signal analysis circuit, and at least one signal generator circuit, wherein the at least one signal analysis circuit and the at least one signal generator circuit are each connected to the at least one port, the calibration method comprising:

consecutively connecting a set of calibration standards to the at least one port and performing a calibration measurement for each calibration standard connected, thereby obtaining a first set of measurement data;

determining, based on a multi-port error model and the first set of measurement data, a plurality of error terms of the multi-port error model, wherein the error terms describe transmissivity and reflectivity properties of at least the at least one port, and wherein at least one of the error terms comprises a product of two error parameters;

connecting an additional calibration standard to the at least one port, wherein the additional calibration standard is a signal source with known properties or a signal sink with known properties;

performing a calibration measurement with the additional calibration standard connected, thereby obtaining a second set of measurement data; and determining the two error parameters based on the second set of measurement data.

2. The calibration method of claim 1, wherein the calibration standards are connected to the at least one port at a reference plane.

3. The calibration method of claim 2, wherein a cable is connected to the at least one port, and wherein the reference plane is located at an end of the cable facing away from the at least one port.

4. The calibration method according to claim 1, wherein the product of two error parameters comprises a first error parameter and a second error parameter, wherein the first error parameter is determined directly based on the second set of measurement data, and wherein the second error parameter is calculated based on the determined product of the two error parameters and based on the first error parameter.

5. The calibration method according to claim 1, wherein a mismatch of the additional calibration standard is corrected based on the first set of measurement data.

6. The calibration method according to claim 1, wherein the test instrument comprises at least one directional coupler, and wherein the at least one signal analysis circuit and the at least one signal generator circuit are connected to the at least one port by the at least one directional coupler.

7. The calibration method according to claim 1, wherein the multi-port error model is an n-term error model.

8. The calibration method of claim 7, wherein the multi-port error model is a four-term error model.

9. The calibration method according to claim 1, wherein the multi-port error model is a two-port error model.

10. The calibration method according to claim 1, wherein exactly one port of the test instrument is calibrated at a time.

11. The calibration method according to claim 1, wherein the additional calibration standard is established as a signal generator, a comb generator, an oscilloscope, or an analog-to-digital converter.

12. The calibration method according to claim 1, wherein the individual calibration standards of the set of calibration standards are provided in a calibration device having a housing, wherein the calibration device further comprises a switching circuit and a connecting port, and wherein the switching circuit is configured to selectively connect one of the calibration standards to the connecting port.

13. The calibration method of claim 12, wherein the additional calibration standard is provided in the housing.

14. The calibration method according to claim 12, wherein the additional calibration standard is provided separately from the calibration device, wherein the calibration device comprises a further connecting port, wherein the switching circuit is configured to selectively connect one of the calibration standards or the further connecting port to the connecting port.

15. The calibration method according to claim 1, wherein the test instrument is a vector network analyzer, a signal generator, or a signal analyzer.

16. The calibration method according to claim 1, wherein the test instrument is a vector signal generator or a vector signal analyzer.

17. A calibration system, comprising a test instrument, a set of calibration standards, and an additional calibration standard, wherein the calibration system includes circuitry configured to perform the calibration method according to claim 1.

* * * * *